(12) United States Patent
Waite et al.

(10) Patent No.: US 8,617,955 B2
(45) Date of Patent: Dec. 31, 2013

(54) METHOD AND SYSTEM FOR FORMING LOW CONTACT RESISTANCE DEVICE

(75) Inventors: Andrew Waite, Beverly, MA (US); Yuri Erokhin, Georgetown, MA (US); Stanislav Todorov, Topsfield, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 61 days.

(21) Appl. No.: 13/181,175

(22) Filed: Jul. 12, 2011

(65) Prior Publication Data

US 2013/0015528 A1      Jan. 17, 2013

(51) Int. Cl.
*H01L 21/8234* (2006.01)

(52) U.S. Cl.
USPC ......................................................... 438/275

(58) Field of Classification Search
None
See application file for complete search history.

(56) References Cited

U.S. PATENT DOCUMENTS

2008/0081481 A1* 4/2008 Frohberg et al. .............. 438/704
2011/0223733 A1* 9/2011 Wirbeleit et al. .............. 438/275

OTHER PUBLICATIONS

Fukutome et al., (110) NMOSFETs Competitive to (001) NMOSFETs: Si Migration to Create (331) Facet and Ultra-Shallow Al Implantation after NiSi Formation, Electron Devices Meeting (IEDM), 2008, pp. 1-4.

* cited by examiner

*Primary Examiner* — Charles Garber
*Assistant Examiner* — Andre' C Stevenson

(57) ABSTRACT

A method of treating a CMOS device. The method may include providing a first stress liner on a transistor of a first dopant type in the CMOS device. The method may further include exposing the CMOS device to first ions in a first exposure, the first ions configured to reduce contact resistance in a source/drain region of a transistor of a second dopant type.

7 Claims, 9 Drawing Sheets

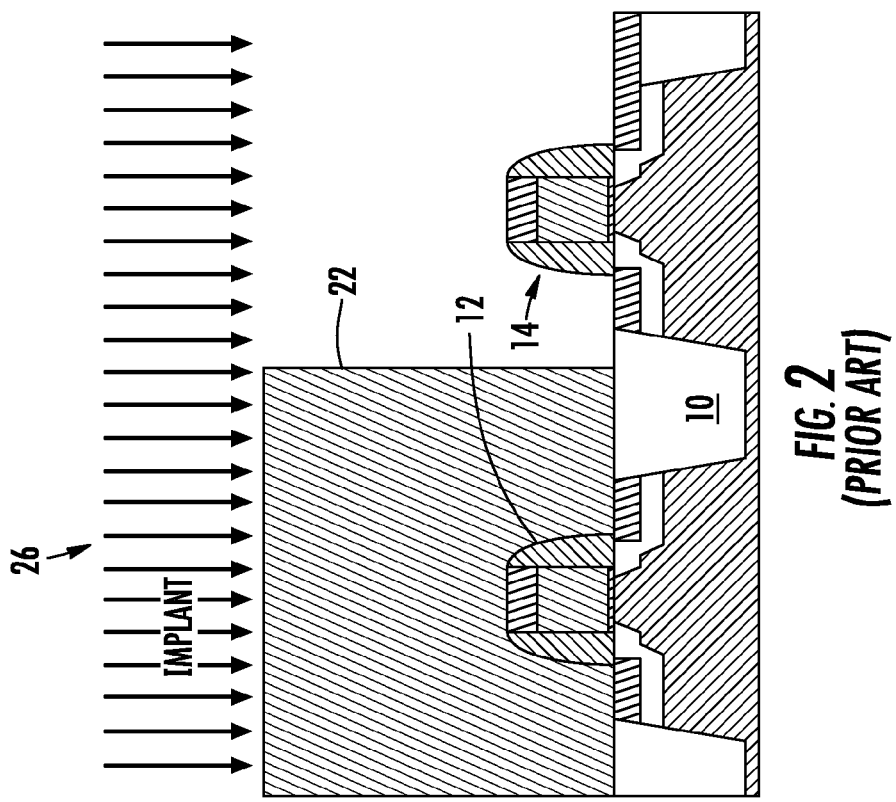
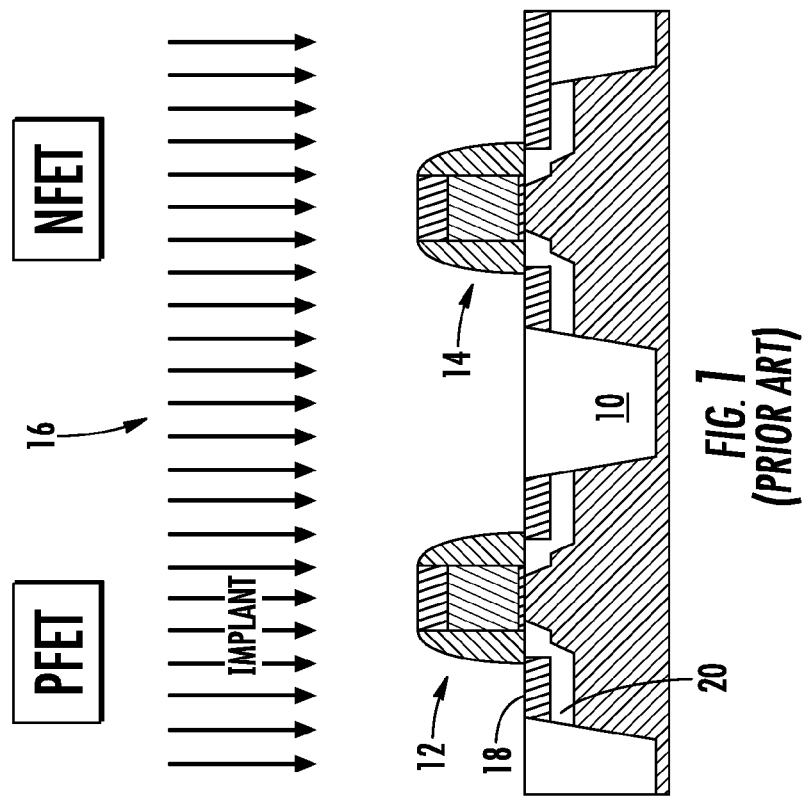
FIG. 1 (PRIOR ART)
FIG. 2 (PRIOR ART)

METHOD AND SYSTEM FOR FORMING LOW CONTACT RESISTANCE DEVICE

BACKGROUND OF THE INVENTION

1. Field of the Invention

Embodiments relate to the field of device manufacturing. More particularly, the present invention relates to a method, system and structure for performing implantation in a CMOS device.

2. Discussion of Related Art

As semiconductor devices such as CMOS devices scale to smaller dimensions, increased contact resistance to source/drain (S/D) areas is becoming an increasing challenge, especially for the 32 nm technology node and below. Contacts to S/D regions in advanced CMOS devices are typically formed using a metallic silicide contact that forms on a semiconductor region of the source/drain. As devices continue to scale to smaller dimensions and channel dimensions continue to shrink, the contact resistance ($R_c$) between silicide and doped S/D constitutes a larger and larger fraction of the overall parasitic resistance. Factors contributing to the S/D contact resistance include the active dopant concentration in the S/D region at the interface between the semiconductor and the metallic contact, and the Schottky barrier height existing between the metallic contact and doped semiconductor.

Because reducing Schottky barrier height results in a reduction of the overall contact resistance, extensive research has been conducted to study materials and processes for lowering the barrier height. Recently, the implantation of novel species such as sulfur, aluminum, selenium, and several other species has been demonstrated to reduce the Schottky barrier height between silicide and the S/D regions in Si-based MOS devices.

FIG. 1 depicts a known implantation scheme for lowering contact resistance in CMOS devices. The substrate 10 includes an n-type field effect transistor (NFET) 12 and a p-type field effect transistor (PFET) 14 region, which are subjected to implanting ions 16. The ions 16 are introduced into CMOS device 10 in S/D regions in a manner in which ions accumulate at or near the interface between silicide contact 18 and doped semiconductor region 20. However, prior art studies have found that implantations may produce different, sometimes opposite, effects on device properties for PMOS devices as opposed to NMOS devices. For example, a given ion species implanted at a first dose and first energy may improve NFET performance, while degrading PFET performance.

In order to address this problem, it may be desirable to tailor interface implants for NFETs and PFETs separately, so that the appropriate implantation species/dose/energy for enhancing $R_c$ in the PFET can be introduced only into the PFET, and the appropriate implantation species/dose/energy for enhancing $R_c$ in the NFET can be introduced only into the NFET. In order to protect the NFET device while performing the PFET implant, the NFET region may be masked, as depicted in FIG. 2. As further depicted therein, ions 26 are directed to a substrate 10 while the NFET 12 is protected by a mask 22, which may be photoresist. The PFET 14 receives ions 26, which are designed to reduce $R_c$ in PFET 14. A converse implantation procedure may be performed, in which the PFET 14 is masked while the NFET 12 is unmasked. The ions employed in the latter procedure are designed to reduce $R_c$ in NFET 12. Thus, in order to optimize interface-modification implants for PFETs and NFETs separately, the extra masking steps required may entail significant additional time and expense. It will be appreciated, therefore, that improvements are desirable in present day methods for lowering device contact resistance.

SUMMARY

In one embodiment, a method of treating a CMOS device comprises providing a first stress liner on a transistor of a first dopant type in the CMOS device. The method may also comprise exposing the CMOS device to first ions in a first exposure, the first ions configured to reduce contact resistance in a source/drain region of a transistor of a second dopant type.

In another embodiment, a low contact resistance CMOS device comprises a first transistor of a first dopant type. The first transistor may have a source/drain region implanted with first ions, wherein the first ions are disposed at a first interface between a metallic contact and a semiconductor portion of a source/drain region of the first transistor, wherein the first ions are configured to lower a barrier height between the semiconductor portion and metallic contact. The first transistor may further include a first stress liner of a first stress type. The low contact resistance CMOS device may also include a second transistor of a second dopant type, the second transistor having a second stress liner of a second stress type that includes implanted first ions.

BRIEF DESCRIPTION OF THE DRAWINGS

FIG. 1 depicts a prior art interface implantation process.

FIG. 2 depicts another prior art interface implantation process.

DESCRIPTION OF EMBODIMENTS

Figure 3A:
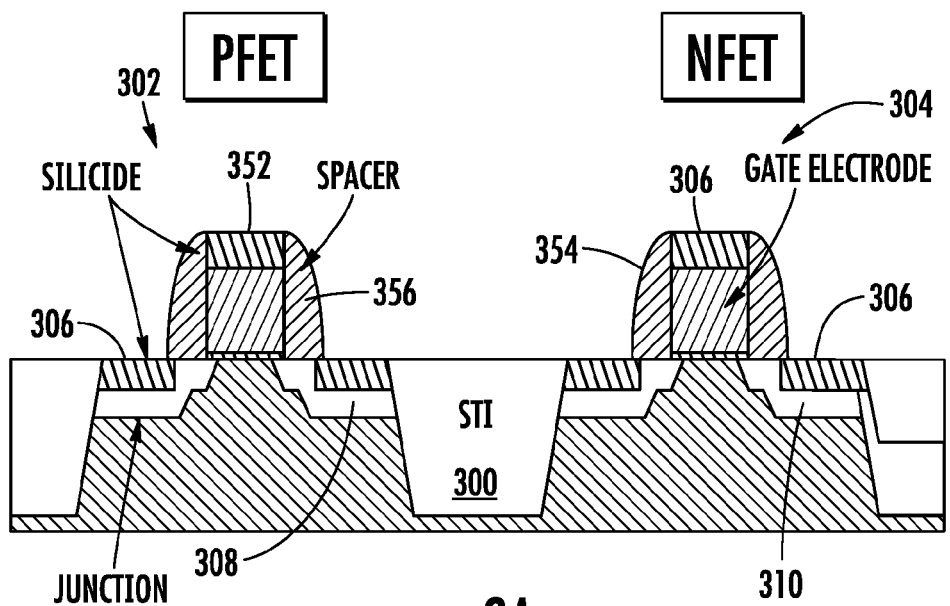
FIGS. 3a-3k depict a side cross-sectional view of a CMOS device structure at several stages of processing according to various embodiments.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

To solve the deficiencies associated with the methods noted above, novel and inventive techniques and systems for implanting a substrate are introduced. In particular, the present disclosure focuses on techniques and device structures involving ion implantation processes for improving the S/D contact resistance in CMOS devices. In various embodiments one or more transistors of a CMOS device includes a stress liner. In some embodiments, the CMOS device includes a dual stress liner (DSL) structure. As used herein, the terms "stress" and "strain" may be used interchangeably to refer to the structures and materials of the DSL process. As will be readily appreciated by those of skill in the art, stress and strain in a solid material are related through the elastic properties of the solid.

The DSL technique is a process widely used in the CMOS manufacturing industry in which two different liners are deposited on respective PMOS and NMOS transistors. The deposited liners are formed on transistors under a stressed state, which induces a strain in semiconductor regions of the transistor. The strain in the semiconductor regions may alter the transport properties, such as carrier mobility in a strained transistor. In particular, the compressive strain induced in silicon, or a silicon-based semiconductor material, is known to enhance carrier mobility in PFETs, while tensile strain is known to enhance carrier mobility in Si-based NFETs. Accordingly, known DSL techniques employ a compressively stressed liner, such as a PECVD silicon nitride layer, which is deposited on top of a PFET device, and a tensilely stressed liner, such as a PECVD silicon nitride layer, which is deposited on top of NFET devices. In this manner, the mobility of both PFET and NFET may be improved by tailoring the stress state of the liner to the type of FET underneath the liner.

In conventional DSL schemes, blanket deposition of a compressively stressed layer is performed to form a liner to cover the PFET. Portions of the compressively stressed blanket deposit that cover the NFET are then selectively removed. A blanket deposition of tensilely stressed deposit is performed to provide a tensilely stressed liner of the NFET, while portions of the tensilely stressed blanket deposit that cover the PFET are selectively removed. The strained liners, which may be PECVD nitride layers, enhance device performance by imparting strain to the silicon transistors, as noted above.

In known processes, either the tensilely stressed liner or the compressively stressed liner may be deposited first. The DSL process typically takes place after silicide formation on the CMOS device in question. In a tensile-first scheme, a silicon nitride film with a tensile strain is first deposited on the wafer. This layer is then patterned and selectively removed by dry etch from on top of the PFETs. A second silicon nitride layer with a compressive strain is then deposited on the wafer and patterned and removed from on top of the tensilely stressed liner. In a compressive-first variation, the compressively stressed liner is deposited first, followed by the tensilely stressed liner.

Embodiments of the present invention take advantage of the process flow in DSL formation by integrating in novel fashion an interface implantation in S/D regions of a CMOS device into a process that includes fabricating dual stress liners. In various embodiments, the implantation of S/D regions entails implanting ions that reduce S/D contact resistance by modifying the interface between the semiconductor portion of the S/D and the overlying metallic contact. This may be accomplished by providing implant species that segregate to the semiconductor/contact interface and thereby lower the barrier height between a metallic S/D contact and the underlying semiconductor region of the S/D.

Advantageously, in various embodiments, the interface-modifying implants are performed without any extra masking steps. In some embodiments, the first silicon nitride stress liner of a DSL process is used as a hardmask for one type of transistor during a S/D implantation process. As detailed below, remaining mask portions of the stress liner may serve to protect those transistors for which the interface-modification implant may increase contact resistance rather than decrease contact resistance, while the desired transistors are exposed to the implant in regions where the stress liner is removed. In this manner, an interface-modification implant may be accomplished without requiring any additional masking processes. In alternative embodiments, either a tensilely stressed or compressively stressed liner is deposited and etched first, enabling the interface-modification implant to be made into either an NFET or PFET.

Some embodiments of the invention employ beamline or plasma-based ion implantation processes to treat S/D regions of CMOS devices. The energy chosen for implantation may be based upon various factors including the nature of the species to be implanted, the nature of the S/D region, the presence of overlayers such as silicide or other metal contacts, and other factors, as will be readily appreciated by those of skill in the art.

The embodiments are also described as techniques using ion based substrate processing systems. However, those of ordinary skill in the art will recognize that other types of sub-atomic, atomic, or molecular particle based substrate processing systems, including plasma sputtering, as well as beam line ion implantation systems, are within the scope of the present disclosure.

Figure 8:
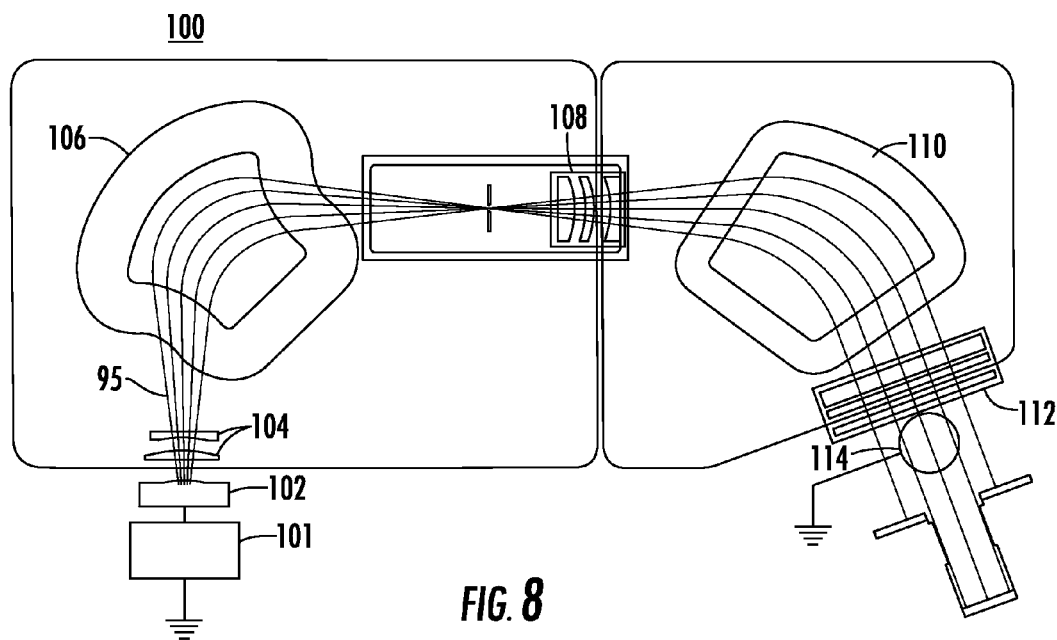
FIG. 8 depicts an embodiment of an ion implantation system.

FIG. 8 is a block diagram of an ion implanter that illustrates general features of ion implanters that may be used in embodiments of the present invention. System 100 includes an ion source chamber 102. A power supply 101 supplies the required energy to source 102 which is configured to generate ions of a particular species. The generated ions are extracted from the source through a series of electrodes 104 (extraction electrodes) and formed into a beam 95 which passes through a mass analyzer magnet 106. The mass analyzer is configured with a particular magnetic field such that only the ions with a desired mass-to-charge ratio are able to travel through the analyzer. Ions of the desired species pass through deceleration stage 108 to corrector magnet 110. Corrector magnet 110 is energized to deflect ion beamlets in accordance with the strength and direction of the applied magnetic field to provide a beam targeted toward a work piece or substrate positioned on support (e.g. platen) 114. In some cases, a second deceleration stage 112 may be disposed between corrector magnet 110 and support 114. The ions lose energy when they collide with electrons and nuclei in the substrate and come to rest at a desired depth within the substrate based on the acceleration energy.

FIGS. 3a-3k depict side cross-sectional views of a CMOS device structure 100 at several stages of processing according to various embodiments. The FIGURES depict aspects of a DSL process, in which a tensilely stressed liner is created on an NFET and a compressively stressed liner is created on a PFET. Integrated into this DSL process is an implantation process for reducing S/D contact resistance without use of additional masking steps.

At FIG. 3a, the CMOS device 300 includes PFET 302 and NFET 304, which include PFET gate 352 and NFET gate 354, respectively. CMOS device 300 further includes contacts 306, which are formed in gate regions and on PFET S/D 308 and NFET S/D 310. In the example depicted in FIG. 3a, the contacts 306 are a metal silicide, which may be formed according to known techniques, such as using a salicide process. However, embodiments of elemental metallic contacts are possible. In some embodiments, the silicide is PtSi or NiSi, or an alloy of NiSi and PtSi (Ni(Pt)Si), but may be other silicides such as ternary alloys between NiSi and rare earth elements, including Dy. In various embodiments, the PFET S/D and NFET S/D comprise a silicon-based material, which may be Si, a known Si:Ge alloy, a known Si:C alloy, an Si:Ge:C alloy, or other material. The PFET S/D may further include known p-type dopants such as B, while the NFET S/D may further include n-type dopants such as As and/or P.

Figure 3B:
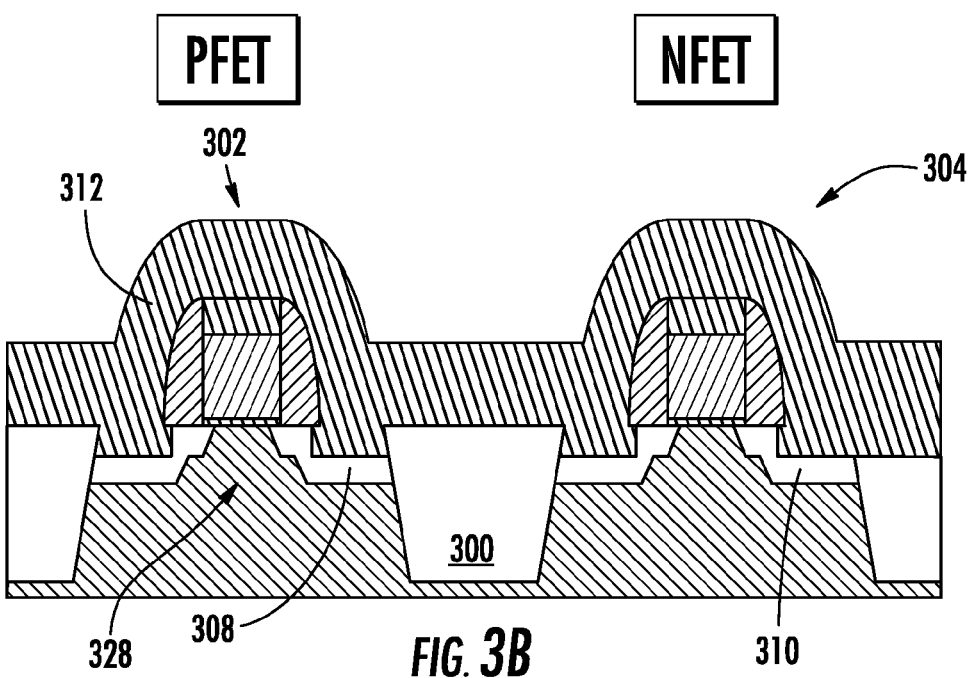

FIG. 3b depicts a subsequent processing stage in which a stress liner 312 is deposited as a blanket coating over the top surface of the CMOS device 300, thereby coating gate and S/D regions. The stress liner may be a compressively stressed liner or a tensilely stressed liner according to different embodiments. However, for the purposes of illustration, in the FIGS. 3b-3k and discussion to follow, stress liner 312 will be deemed a compressively stressed liner (also referred to herein as a "compressive liner" for brevity; a tensilely stressed liner is also referred to herein as a "tensile liner"). The compressive liner 312 may be deposited by known techniques including chemical vapor deposition, physical vapor deposition, or other technique. In some embodiments, the compressive liner 312 may be silicon nitride.

After deposition, compressive liner 312 exerts a force on the CMOS device 300, which serves to impart a compressive strain within PFET S/D regions 308 and PFET channel 358. This strain may increase carrier mobility in devices subject to the strain. For example, for silicon-based CMOS devices, a compressively strained silicon crystal lattice may result in an increase in hole mobility, leading to better PFET performance, as will be appreciated by those of skill in the art.

However, the compressive strain imparted into NFET regions of the CMOS device 300 may degrade, rather than enhance device performance, as is known. Accordingly, in subsequent processing, portions of the compressive liner may be removed from NFET regions and may be replaced by a tensile liner, thereby forming a dual stress liner.

Figure 3C:
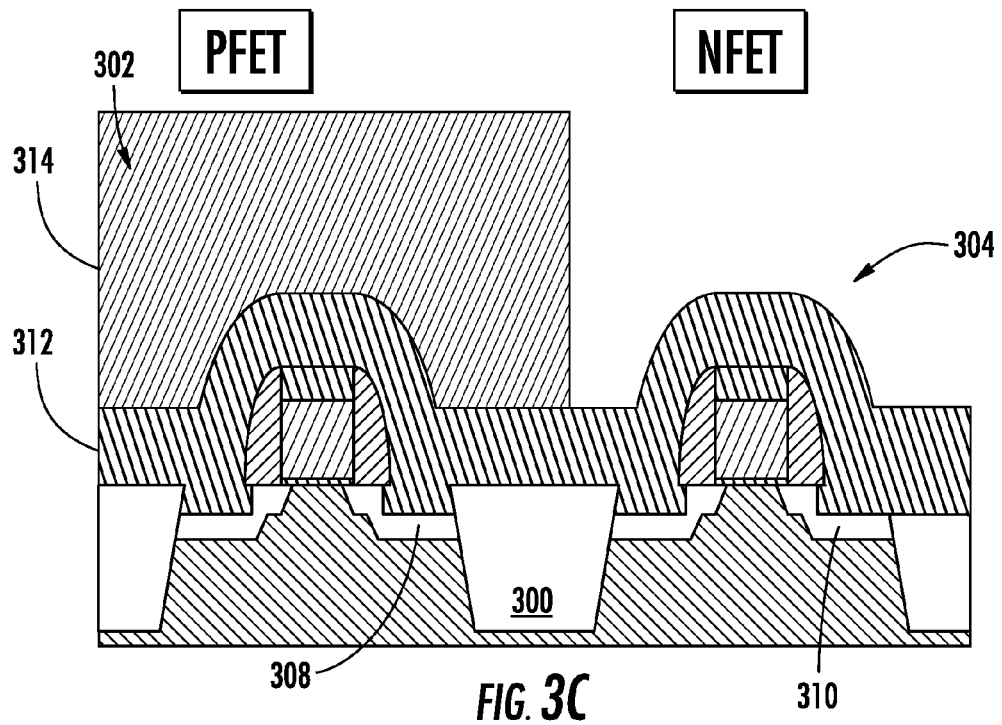

FIG. 3c depicts a further stage in which a mask 314 is formed over the PFET 302 region but not the NFET 304 region. This may be accomplished by known lithographic techniques in which the mask 314 is a resist, such as a photoresist. Mask 314 serves to protect regions of the compressive liner that are disposed on PFET 302. After patterning the resist to form mask 314, the CMOS device 100 may be subjected to an etch to remove unwanted portions of the compressive liner 312. The etch may be a blanket etch to remove silicon nitride in some embodiments.

Figure 3D:
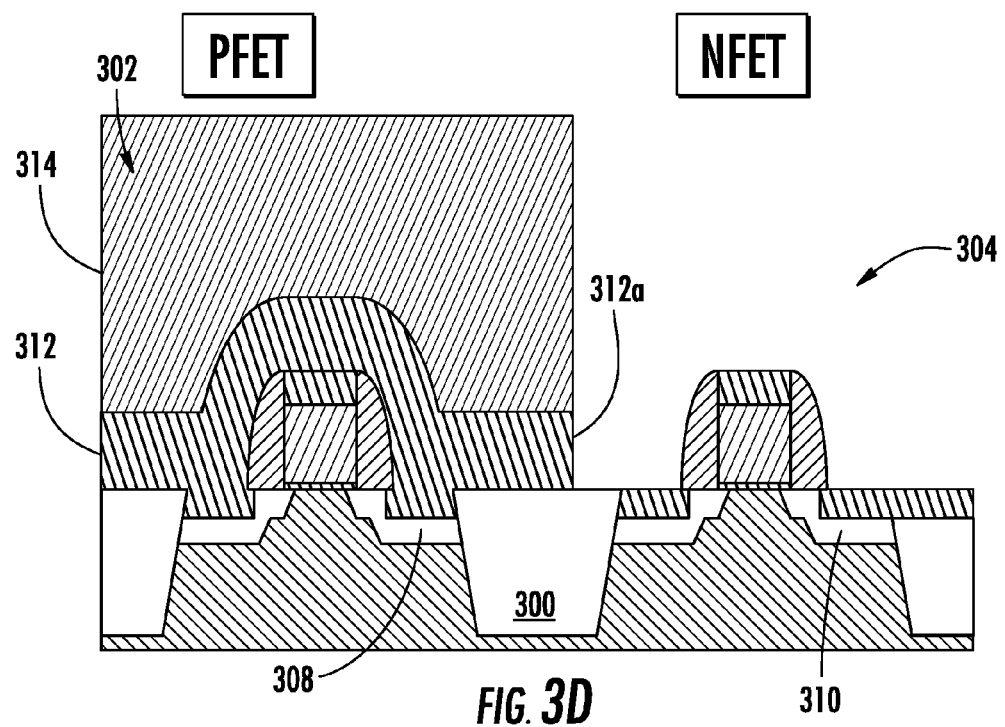

FIG. 3d depicts a stage of CMOS device 300 after selective removal of portions of compressive liner 312 from the NFET 304. Compressive liner 312 now includes compressive liner portion 312a, which remains on PFET 302. The compressive liner portion 312a may serve to increase hole mobility and thereby device performance of PFET 302. At the same time, NFET 304 no longer is subjected to compressive strain from compressive liner 312.

Figure 3E:
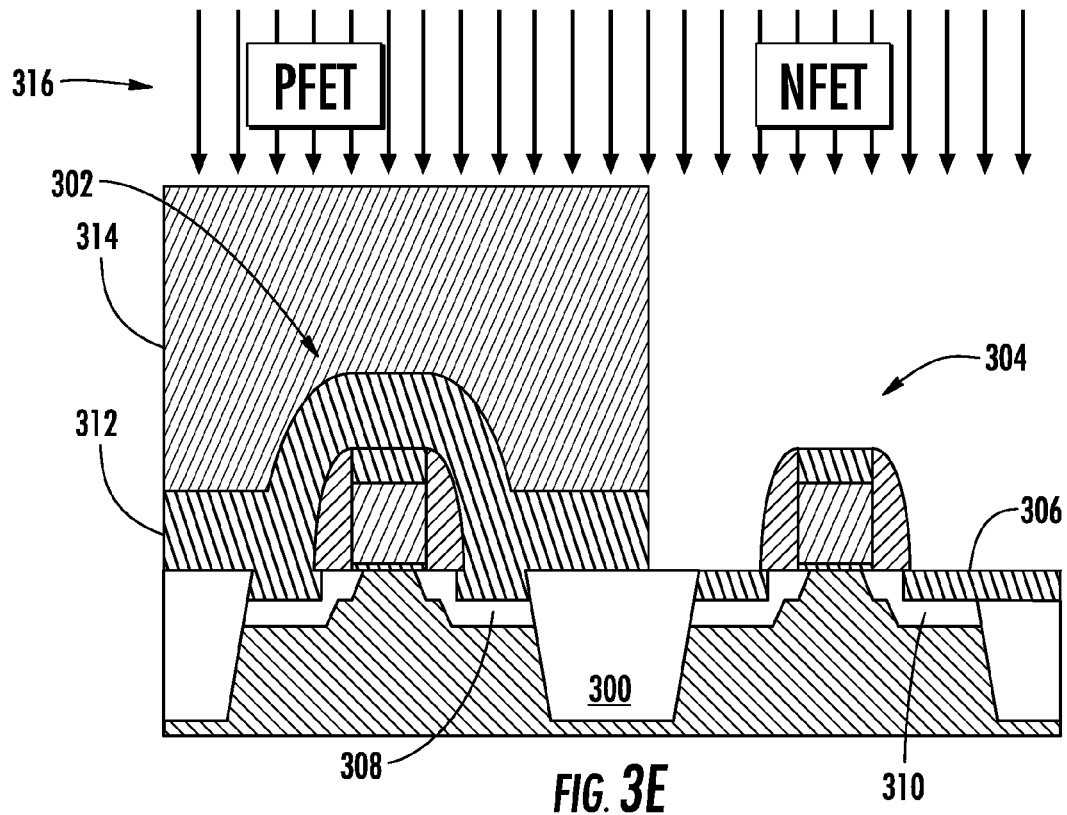

FIG. 3e depicts a subsequent stage of processing of CMOS device 300 according to some embodiments. The CMOS device 300 is subjected to an exposure of ions 316, which may be a blanket ion exposure using a beam line or plasma immersion ion implanter in various embodiments.

Figure 3F:
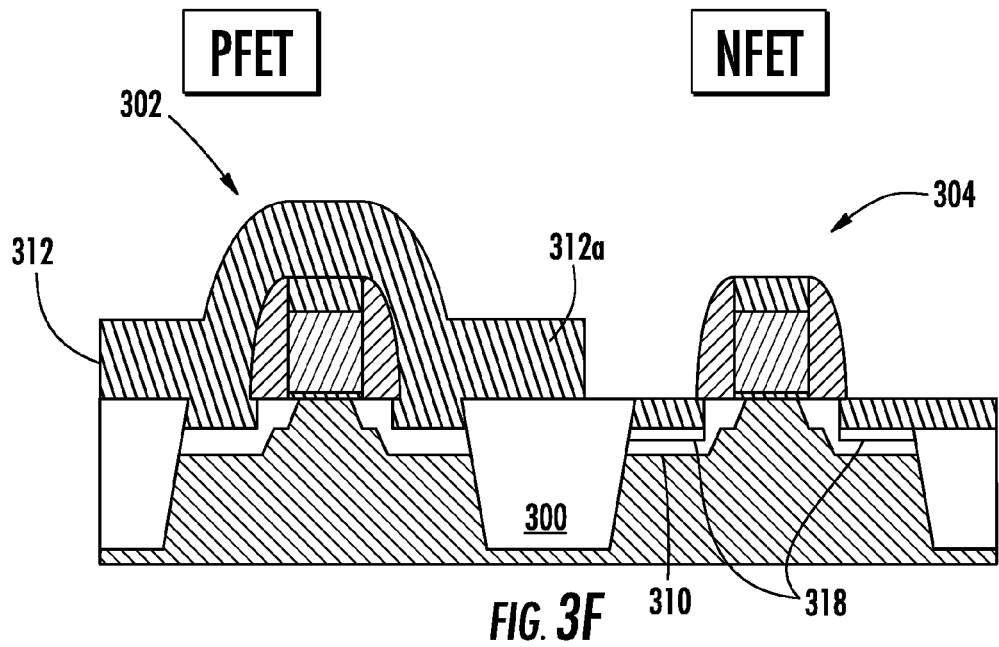

The ion exposure depicted at FIG. 3e may be a so-called interface-modification implant in which ions 316 are configured to implant into exposed S/D regions of CMOS device 300. In particular, the ions 316 may be implanted into NFET S/D regions 310. The ion energy may be designed to introduce the implanting species into the vicinity of an interface between silicide contact 306 and NFET S/D regions 310. For example, the ion energy, ion species, and implant angle may be designed for ions 316 to substantially penetrate through the silicide contact 306 and into NFET S/D region 310. Subsequently, the implanted species corresponding to ions 316 may at least partially accumulate near the interface, as depicted in FIG. 3f. The ions 316 that impact NFET 304 may be configured to improve contact resistance in NFET 304 by lowering Schottky barrier height between silicide 306 and NFET S/D region 310. The ions 316 that impinge on CMOS device 300 above PFET 302, on the other hand, are screened by resist 314 and compressive liner 312, so that the S/D region 308 does not receive ions 316.

In various embodiments, the ions may include one or more of S, Se, Al, rare earth ions, and other species. The ion dose may range between about 1xE13 and 1xE16 in some embodiments, and the ion energy may range from several hundred eV to about 50 keV.

At a subsequent stage depicted at FIG. 3f, the mask 314 may be removed from PFET 302. As depicted, NFET 304 includes a modified interface 318 formed by the interface-modification implant using ions 316, as described above. The modified interface 318 may result in the NFET having higher performance due to lower contact resistance in the region of NFET S/D 310.

Figure 3G:
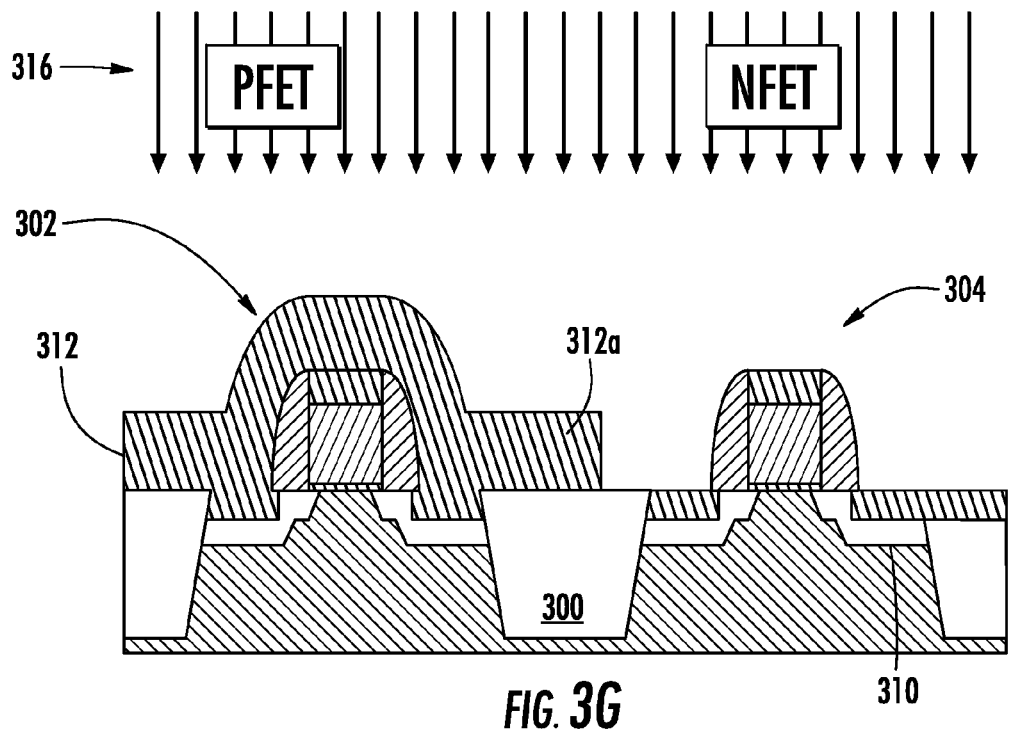

In an alternative embodiment, depicted at FIG. 3g, the interface-modification implant may be performed after removal of mask 314 instead of being performed with the mask 314 in place, as depicted in the embodiment of FIG. 3e. In the scenario of FIG. 3g, the ion energy may be the same as or different from that employed in the scenario of FIG. 3e. For example, because there is less material to attenuate ions 316 from striking PFET 302, the ion energy may be lower than that employed when mask 314 is in place.

Figure 3H:
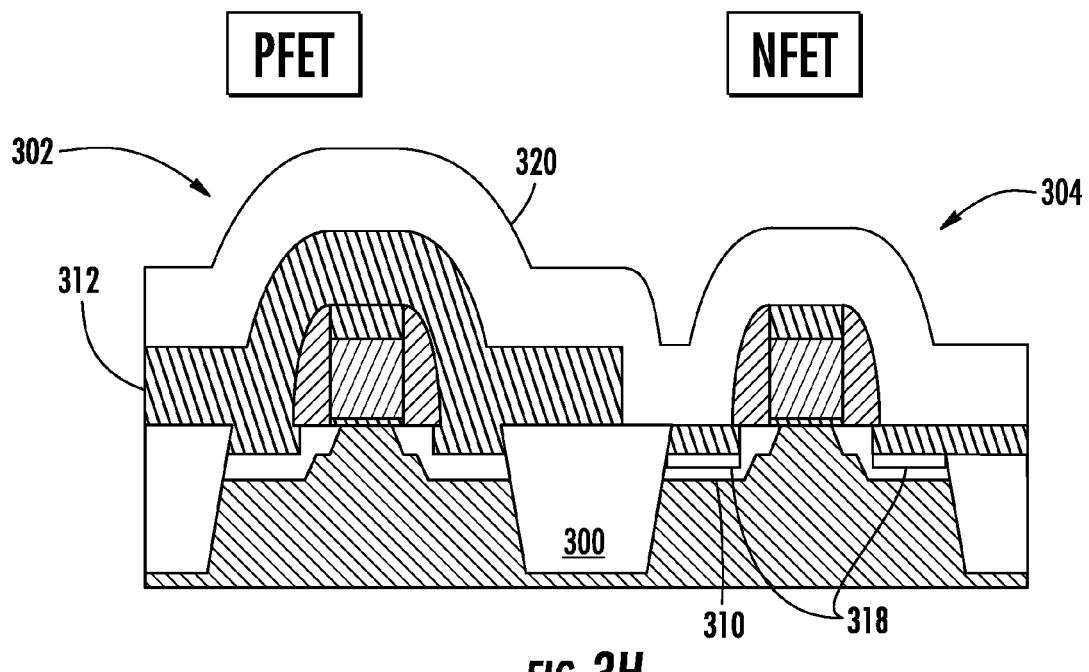

FIG. 3h depicts a subsequent stage in which a tensile liner 320 is formed in a blanket deposition over the CMOS device 300. In various embodiments, the tensile liner 320 may be a silicon nitride layer that is deposited under conditions configured to induce tensile stress in the liner. A tensile liner may be cured by an ultraviolet curing process to enhance NFET device performance in some embodiments. The tensile liner 320 may thereby induce compressive strain within underlying regions of CMOS device 300, including in NFET 304.

Figure 3I:
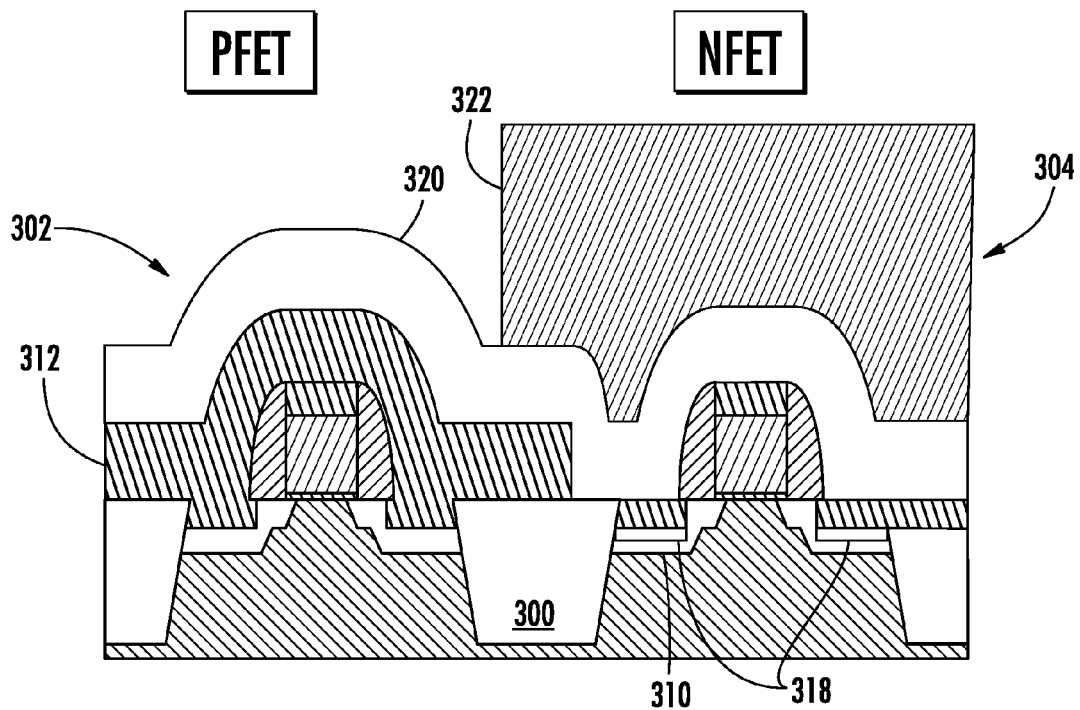

In further processing, depicted at FIG. 3i, a mask 322 is formed to protect portions of liner 320 that cover NFET 304. Subsequently, at the stage depicted in FIG. 3j, a portion of the tensile liner 320 is removed from those regions covering PFET 302. This may be accomplished by performing a blanket etch that removes tensile liner 320 in regions that are not protected by mask 322. The etch may be a timed etch configured to remove all or most of tensile liner 320 while leaving compressive liner portion 312a intact. Alternatively, a known etch stop layer (not shown) may be provided between tensile liner 320 and compressive liner portion 312a to facilitate removal of tensile liner 320 above PFET 302 without the need for an accurate timed etch.

Figure 3J:
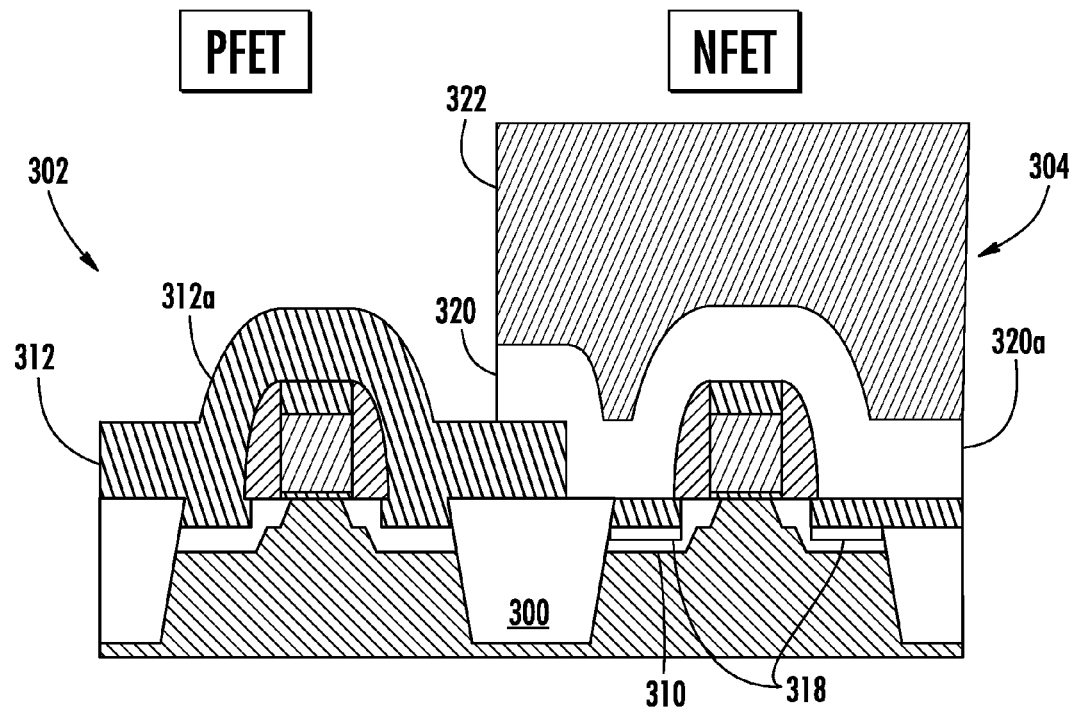
Figure 3K:
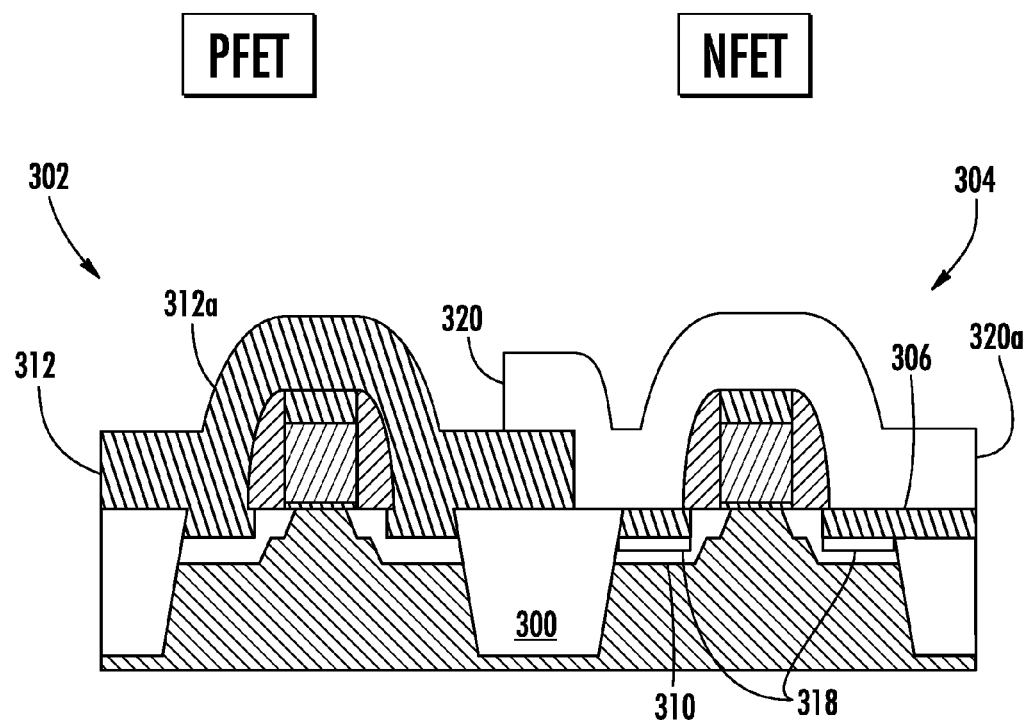

At the stage depicted in FIG. 3k, the mask 322 is removed, leaving a dual stress liner structure on CMOS device 300, which includes compressive liner portion 312a and tensile liner portion 320a. The CMOS device 300 may accordingly exhibit enhanced performance due to the strain-induced enhanced mobility for electrons in PFET 302 and for holes in NFET 304. CMOS device 300 also includes modified interface 318 in the NFET S/D region 310, which may lower barrier height between NFET S/D region 310 and silicide contact 306, thereby further enhancing device performance due to lower contact resistance in NFET S/D region 310.

As noted previously, in other embodiments, a dual stress liner process may involve forming a tensile liner first and subsequently forming a compressive liner. In such embodiments, after deposition of a blanket compressive liner, a mask may be formed over a PFET, and subsequently used to screen the PFET from an ion exposure that forms an interface modifying implant of the S/D region of an NFET.

Figure 4:
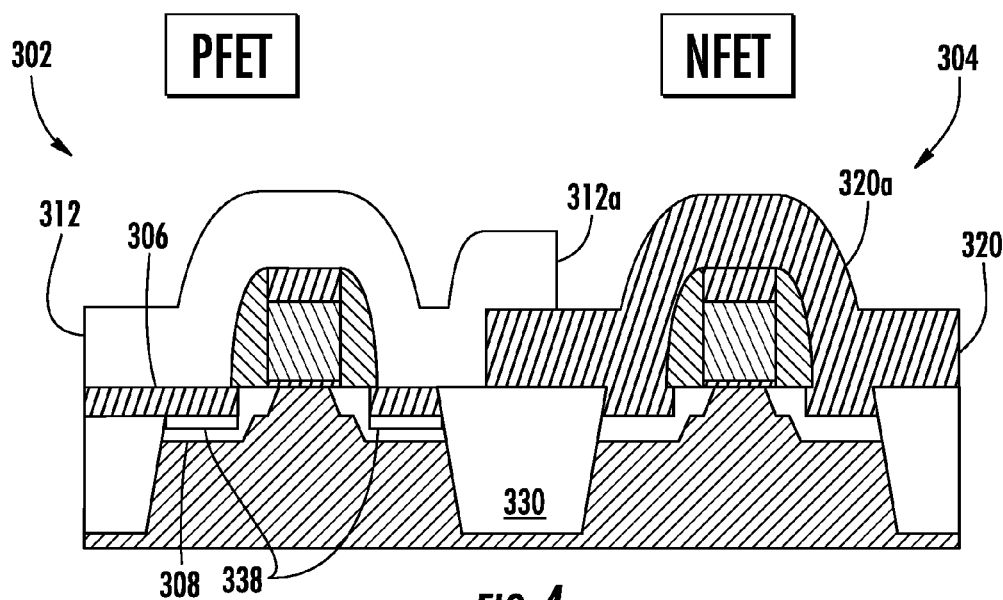
FIG. 4 depicts a CMOS device according to a DSL embodiment.

FIG. 4 illustrates an embodiment of a CMOS device produced according to a "tensile liner first" DSL process in which the PFET exhibits a S/D having a modified interface. As depicted, CMOS device 330 includes a tensile liner portion 320a that is formed over NFET 304, and a subsequently formed compressive liner portion 312a formed over PFET 302. CMOS device 330 also includes a modified interface 338 in the PFET S/D region 308, which may lower barrier height between PFET S/D region 308 and silicide contact 306. As with CMOS device 300, in this embodiment, the CMOS device 330 may also exhibit enhanced performance due to the strain-induced enhanced mobility for holes in PFET 302 and for electrons in NFET 304. The PFET 302 may exhibit further enhanced performance due to lower contact resistance induced by the interface layer 338.

Advantageously, either of CMOS devices 300 or 330 may be formed without requiring any additional masking steps to perform an interface-modification implant. Thus, according to the present embodiments, a DSL CMOS device in which either the PFET or NFET has reduced contact resistance may be formed with minimal additional steps beyond those performed for a conventional DSL process.

In other embodiments, a dual interface-modification implant process and structure may be integrated into a DSL CMOS device. In embodiments of a dual interface-modification implant, the NFET and PFET S/D regions may be separately subjected to ion implantation. Implantation recipes which may include a combination of ion species/ion dose/ion energy used for the implants may be separately tailored for the NFET and PFET S/D regions. This may be accomplished by modifying the procedure described above for forming a CMOS device that combines a DSL process with a single interface-modification implant.

Figure 5:
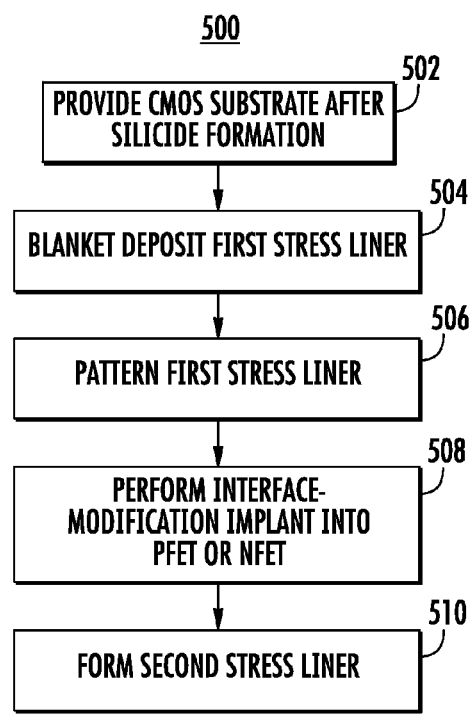
FIG. 5 depicts exemplary processes of a method according to one embodiment.
Figure 6:
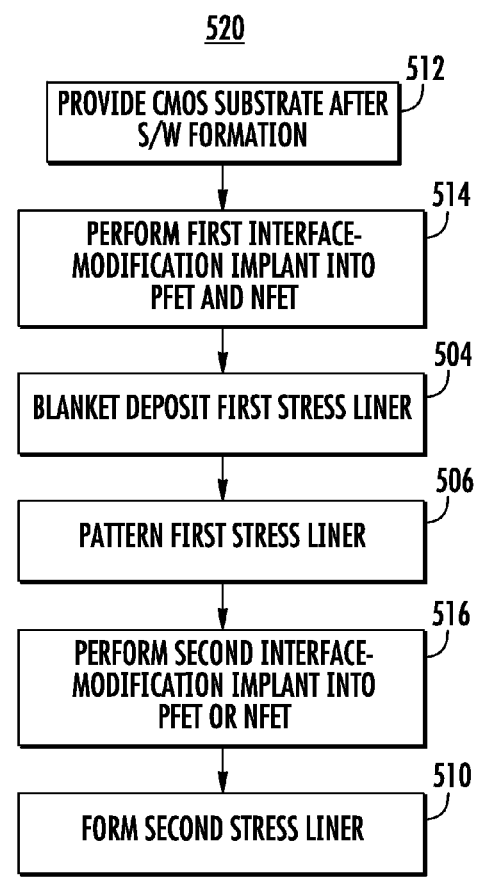
FIG. 6 depicts exemplary processes of a method according to another embodiment.

To highlight features of the dual interface-modification implant process, FIGS. 5 and 6 compare aspects of exemplary methods 500 and 520 for single interface-modification implants and dual interface-modification implants, respectively. Turning first to FIG. 5, at block 502 a CMOS substrate is provided at the stage where a metallic S/D contact, such as a silicide, has already been formed. At block 504 a blanket deposit of a first stress liner is performed. As noted above the blanket stress liner may be a compressive liner or a tensile liner in different embodiments. At block 506, the first stress liner is patterned to remove portions of the first stress liner from the FET (either PFET or NFET according to different embodiments) to receive the single interface modifying implant. Once the first stress liner is patterned, an interface-modification implant (block 508) is performed to alter the contact resistance of the exposed FET, while the unexposed FET does not receive the implant, as depicted at FIGS. 3e and 3g. Subsequently, a second stress liner of opposite stress to the first stress liner is deposited and patterned (block 510), as also depicted at FIGS. 3h-3j.

Turning now to FIG. 6, which depicts a dual interface-modification implant process, at block 512 a CMOS device (substrate) is provided after formation of sidewalls on the transistor gates of the NFET and PFET devices.

At block 514, an interface-modification implant using a first recipe is performed into both NFET and PFET regions. In this case, both NFETs and PFETs are exposed to a blanket implantation, such that neither FET has a masking layer to protect the S/D region. In various embodiments, the interface-modification implant is designed to enhance performance in either the NFET or PFET of a CMOS device. As detailed above, known implantation recipes (ion species/ion energy/ion dose) have been observed to improve performance in a FET of a first polarity (such as an NFET) while having an opposite effect on a FET of the second polarity (such as a PFET). Accordingly, the interface-modification implant at block 414 may be effective in reducing contact resistance in only an NFET region or only a PFET region. The FET for which the implant is not desirable may nevertheless be treated subsequently to improve contact resistance and/or address any deleterious effect of the implant at block 514.

The method then proceeds to blocks 504 and 506, as described above. In this embodiment, the type of stress liner chosen for the first stress liner is based upon the type of implanting species used at block 514. Accordingly, if an interface modifying implant at block 514 is chosen to enhance NFET performance, then the first stress liner, deposited at block 504, is chosen to be a tensile liner. At block 506, the first liner, such as a tensile liner, is patterned to expose the FET for which an additional implant is desired, such as PFET regions.

At step 516, a second implantation using a second recipe is performed. In some embodiments, the second interface-modification implant may employ a second species that is different from that employed at block 514, which may improve the interface of the FET in question and may compensate for deleterious effects of the first implantation. In other cases, the second interface-modification implant may be an additional dose of the first species, where the additional dose in combination with the first dose is effective in improving properties of the FET in question. Thus, following the present example, if the implantation recipe for the interface modifying implant at block 514 is chosen to enhance NFET performance, the recipe employed at block 516 may be designed to enhance PFET performance. Because the PFET regions are unprotected, the PFET S/D regions are implanted with the impinging species, whose effect may be to reduce PFET contact resistance. Because the second implantation may at least in part be used to compensate for any deleterious effects of the first implantation, the implantation recipe used at block 516 may be different than that employed for single interface modifying implant 508 of method 500. For example, the dose of ion species may be greater in the recipe of block 516.

Figure 7:
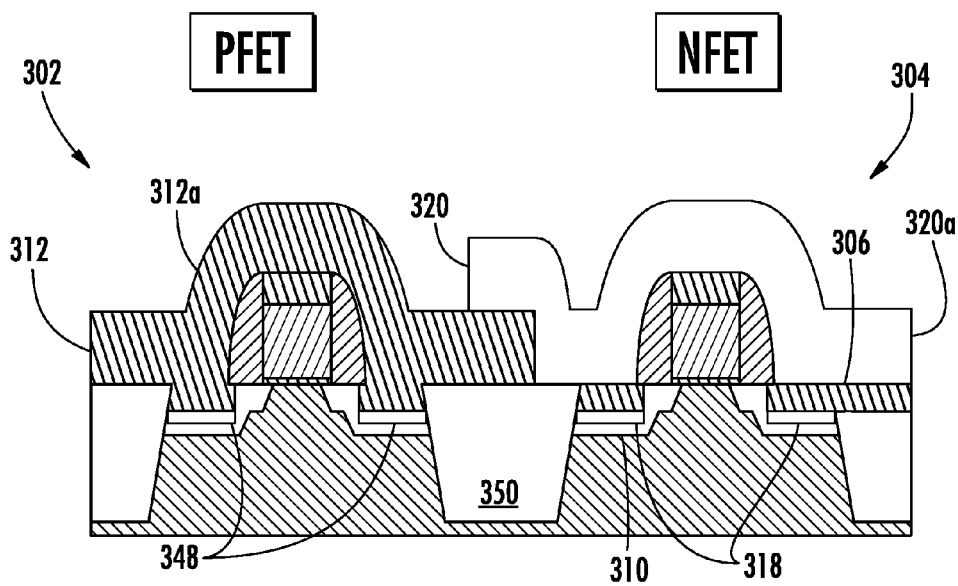
FIG. 7 depicts an exemplary CMOS device according to a DSL embodiment with dual interface modifying implants.

The method then proceeds to block 510, where a second stress liner is formed, as described above. Thus, in various embodiments a dual interface-modification implant process may be performed in conjunction with a DSL process without the necessity of extra masking steps. FIG. 7 depicts a CMOS device 350 so constructed. Advantageously, CMOS device 350 may have enhanced carrier mobility as well as reduced contact resistance in both PFET and NFET devices. As depicted, CMOS device 350 includes a modified interface 318 in the NFET S/D region, as well as a modified interface 348 in the PFET S/D region. In one example, the modified interface 348 may be created from an initial interface-modification implant (block 514) followed by a second interface-modification implant (block 516), which serves to adjust the interface to reduce the contact resistance in PFET S/D region 308.

In accordance with different embodiments, the first interface-modification implant may be performed at different points. In one embodiment, the interface-modification implant at block 514 takes place after dopants are introduced into the S/D regions but before an anneal is performed to activate the implanted dopants. In an alternative embodiment, the implant block 514 takes place after S/D dopants are implanted and annealed but before silicide contacts on S/D regions are formed. In a further embodiment, the implant block 514 takes place after silicide contacts are formed, as generally depicted at FIG. 1.

The present invention is not to be limited in scope by the specific embodiments described herein. Indeed, other various embodiments of and modifications to the present disclosure, in addition to those described herein, will be apparent to those of ordinary skill in the art from the foregoing description and accompanying drawings. As an example, embodiments may employ masking material on top of substrate features during ion bombardment so as not to reduce the height of a patterned feature if desired. Embodiments in which ions are directed at sidewalls over a single angle of incidence are also possible.

Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the subject matter of the present disclosure should be construed in view of the full breadth and spirit of the present disclosure as described herein.

What is claimed is:

1. A low contact resistance CMOS device, comprising:
    a first transistor of a first dopant type, the first transistor comprising;
    a source/drain region implanted with first ions, the first ions disposed at a first interface between a metallic contact and a semiconductor portion of a source/drain region of the first transistor, wherein the first ions are configured to lower a barrier height between the semiconductor portion and metallic contact; and
    a first stress liner of a first stress type; and
    a second transistor of a second dopant type, the second transistor having a second stress liner of a second stress type that includes implanted first ions.

2. The CMOS device of claim 1, wherein the metallic contact is suicide.

3. The CMOS device of claim 1, the second stress type being opposite the first stress type.

4. The CMOS device of claim 3, the first stress liner configured to increase carrier mobility in the first transistor and the second stress liner configured to increase carrier mobility in the second transistor.

5. A method of forming low contact resistance in a dual stress liner CMOS device, comprising:
    providing a first stress liner of a first stress type in a blanket deposition on the CMOS device;
    patterning the first stress liner to remove the first stress liner from a first transistor of a first dopant type disposed on a surface of the CMOS device; and
    exposing the CMOS device to first ions, wherein the first ions are implanted into a source/drain region of the first transistor, wherein the first ions are prevented from implanting into a source drain region of a second transistor of a second dopant type disposed on the surface of the CMOS device.

6. The method of claim 5, further comprising:
    providing a second stress liner of a second stress type opposite the first stress type in a blanket deposition on the CMOS device;
    patterning the second stress liner to remove the second stress liner from the second transistor of the second dopant type.

7. The method of claim 5, comprising exposing the first and second transistor of the CMOS device to second ions of a second dopant type before the providing the first stress liner.

* * * * *

UNITED STATES PATENT AND TRADEMARK OFFICE
CERTIFICATE OF CORRECTION

PATENT NO.       : 8,617,955 B2                                              Page 1 of 1
APPLICATION NO.  : 13/181175
DATED            : December 31, 2013
INVENTOR(S)      : Andrew Waite et al.

It is certified that error appears in the above-identified patent and that said Letters Patent is hereby corrected as shown below:

In the Claims

Column 10, Line 5, Claim 2, "suicide" should be changed to --silicide--

Signed and Sealed this
Fourth Day of March, 2014

Michelle K. Lee
*Deputy Director of the United States Patent and Trademark Office*